United States Patent
Kendall et al.

(10) Patent No.: US 6,425,062 B1
(45) Date of Patent: Jul. 23, 2002

(54) CONTROLLING BURST SEQUENCE IN SYNCHRONOUS MEMORIES

(75) Inventors: Terry L. Kendall, Diamond Springs; Kenneth G. McKee, Shingle Springs; Kishore Rao, Folsom, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/395,870

(22) Filed: Sep. 14, 1999

(51) Int. Cl.$^7$ .............................................. G06F 12/00
(52) U.S. Cl. ..................... 711/167; 711/113; 365/238.5
(58) Field of Search .............................. 711/167, 103; 365/185.25–238.5

(56) References Cited

U.S. PATENT DOCUMENTS

| | | | |
|---|---|---|---|
| 5,390,149 A | * 2/1995 | Vogley et al. | 365/189.01 |
| 5,490,114 A | 2/1996 | Butler et al. | 365/189.05 |
| 5,513,135 A | 4/1996 | Dell et al. | 365/52 |
| 5,526,320 A | * 6/1996 | Zagar et al. | 365/233.5 |
| 5,560,000 A | 9/1996 | Vogley | 395/550 |
| 5,572,722 A | 11/1996 | Vogley | 395/555 |
| 5,587,961 A | 12/1996 | Wright et al. | 365/233 |
| 5,608,896 A | 3/1997 | Vogley | 395/558 |
| 5,615,358 A | 3/1997 | Vogley | 395/556 |
| 5,627,985 A | 5/1997 | Fetterman et al. | 395/393 |
| 5,630,096 A | 5/1997 | Zuravleff et al. | 395/481 |
| 5,655,105 A | 8/1997 | McLaury | 395/496 |
| 5,659,515 A | 8/1997 | Matsuo et al. | |
| 5,673,233 A | 9/1997 | Wright et al. | 365/233 |
| 5,715,421 A | * 2/1998 | Akiyama et al. | 365/203 |
| 5,784,705 A | 7/1998 | Leung | |
| 5,903,496 A | 5/1999 | Kendall et al. | |
| 6,026,465 A | * 2/2000 | Mills et al. | 711/103 |
| 6,067,274 A | * 5/2000 | Yoshimoto | 365/238.5 |
| 6,147,910 A | * 11/2000 | Hsu et al. | 365/185.25 |

OTHER PUBLICATIONS

PCT Search Report mailed Mar. 7, 2001 for counterpart PCT Application No. PCT/US00/40795.

* cited by examiner

*Primary Examiner*—Bo Hyun Yoo
*Assistant Examiner*—Nasser Moazzami
(74) *Attorney, Agent, or Firm*—Blakely, Sokoloff, Taylor & Zafman LLP

(57) ABSTRACT

A system and apparatus for controlling a burst sequence in a synchronous memory is described. In one embodiment, the system comprises a synchronous memory and a burst read device coupled to the synchronous memory. In one embodiment, the burst read device is configured to sense a page of data as a current page from the synchronous memory, wherein the current page contains a fixed number of words of data. The device is further configured to latch the current page of data, and synchronously read the current page of data, one word at a time. In an alternate embodiment, the burst read device further comprises a wrap-bit. If the wrap-bit is not set, the burst read device is configured to latch the current page of data, adjust a word pointer to indicate a next word of data, and repeat latching and adjusting in a sequential burst read order. If the wrap-bit is set, the burst read device is configured to latch the current page of data, adjust a word pointer to indicate a next word of data, and repeat latching and adjusting in a non-sequential burst read order.

6 Claims, 4 Drawing Sheets

CONTROLLING BURST SEQUENCE IN SYNCHRONOUS MEMORIES

FIELD OF THE INVENTION

The present invention pertains to the field of memory devices. More particularly, this invention relates to the art of sequential burst read operations in nonvolatile memory.

BACKGROUND OF THE INVENTION

Advances in computer technology have led to increasingly faster microprocessors. These faster microprocessors are capable of running increasingly larger software applications, which require faster, higher capacity memory devices. At the same time, the trend in computer technology is toward smaller, lighter, and less expensive computers. When selecting a memory device, computer designers often have to trade speed for size, cost, or storage density. A wide variety of memory devices, each with certain strengths and weaknesses, are available. Among these memory devices, flash memory has proven to be particularly useful.

Although the write and erase operations in flash memory are comparatively long, the nonvolatility and rewritability of flash memory are desirable features for a number of applications. For example, using flash to store a computer system's Basic Input Output system (BIOS) and boot code permits the user to update the BIOS without having to replace the storage medium. Because flash memory read operations are much faster than write and erase operations, flash memory is also useful for storing "ROMable" (i.e. read only), or "read mostly" files. For example, operating system and application files can be divided up into ROM-able and read/write portions. The ROMable portions can be executed directly from flash memory, rather than waiting for the files to be loaded from hard disk to random access memory (RAM).

Even in ROMable, or infrequently updated applications, flash presents certain challenges. For instance, a flash memory read operation is typically asynchronous, meaning that data is read out of flash memory a set time after an address is provided. In other words, data is not provided in response to a clock signal. So, if the clock rate of a high speed bus connected to a flash memory is running faster than the access time of the flash memory, every memory access could introduce wait states on the high speed bus. Thus, a burst read operation might result in a wait state for each address read.

One approach to this problem is to perform a page read in synchronous mode. Instead of reading one byte or word of data for each address, a page of data is read at a time. Each page of data includes a number of words of data. The words of data are buffered and provided to the bus synchronously, one word at a time. By reading data a page at a time, wait states are only incurred once every page of data rather than once every word or byte of data. When a large block of contiguous data is read from flash memory in a burst, however, the accumulated wait states can have a significant performance impact, even if wait states are incurred only once every page of data.

Synchronous memories have been developed that significantly improve performance by eliminating the step of opening a new page of data using a speculative read mode or by interleaving page read operations. These memories provide the ability to open a page of data in the memory with the use of a controller in response to a data request. However, these memories continue reading from the page with an invalid address until a second read request occurs.

SUMMARY OF THE INVENTION

A system and apparatus for controlling a burst sequence in a synchronous memory is described. In one embodiment, the system comprises a synchronous memory and a burst read device coupled to the synchronous memory. In one embodiment, the burst read device is configured to sense a page of data as a current page from the synchronous memory, wherein the current page contains a fixed number of words of data. The device is further configured to latch the current page of data, and synchronously read the current page of data, one word at a time.

In an alternate embodiment, the burst read device further comprises a wrap-bit. If the wrap-bit is not set, the burst read device is configured to latch the current page of data, adjust a word pointer to indicate a next word of data, and repeat latching and adjusting in a sequential burst read order. If the wrap-bit is set, the burst read device is configured to latch the current page of data, adjust a word pointer to indicate a next word of data, and repeat latching and adjusting in a non-sequential burst read order.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A system and method for controlling burst sequence in synchronous memories is described. The invention provides a mechanism that allows for limited burst length access that consume minimal memory power. In one embodiment, a fixed-length burst access is provided. In addition, a burst wrap configuration bit is added to a nonvolatile memory array's configuration register. This bit determines if multi-word burst access wrap within the burst-length boundary or across these boundaries to perform linear accesses. A no-wrap mode controls the memory's wait signal, which informs the system processor of valid data availability and may hold off memory fetches. In the no-wrap mode, the system operates in a fixed-length linear burst mode and consumes less power than with typical linear burst systems.

In the following detailed description of the present invention, numerous specific details are set forth in order to provide a thorough understanding of the present invention. However, it will be apparent to one skilled in the art that the present invention may be practiced without these specific details. In some instances, wellknown structures and devices are shown in block diagram form, rather than in detail, in order to avoid obscuring the present invention.

Figure 1:
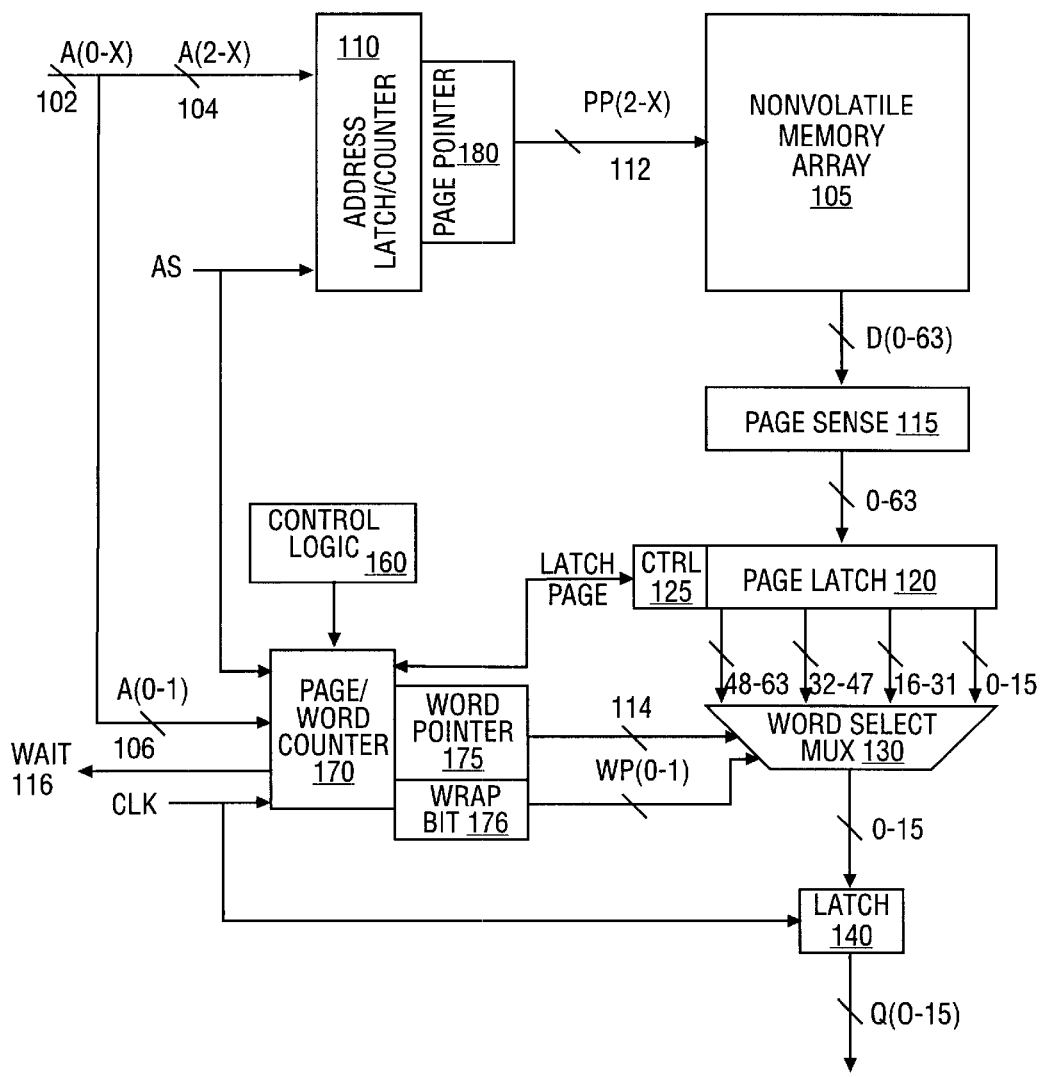
FIG. 1 is a block diagram of a nonvolatile memory device with a limited length burst read memory interface.

FIG. 1 is a block diagram of one embodiment for a nonvolatile memory system 100 with a limited length burst read memory interface. System 100 is configured to provide a stream of logically contiguous data from nonvolatile memory array 105 in fixed-length bursts. In one embodiment, system 100 may be configured to read 4-word fixed length page bursts. In addition, system 100 may be configured to wrap or not wrap within the burst-length boundary or cross boundaries to perform linear accesses. Words of data are read from nonvolatile memory array 105 one page at a time, wherein a page of data includes a fixed number of words of data. After an initial number of wait states, words of data are synchronously read from nonvolatile memory array 105 without incurring additional wait states between words of data.

System 100 includes nonvolatile memory array 105, address latch/counter 110, page sense 115, page latch 120, word select multiplexer (MUX) 130, latch 140, control logic 160, and page/word counter 170 coupled as shown. In one embodiment, nonvolatile memory array 105 comprises flash memory. In alternate embodiments, nonvolatile memory may be an erasable programmable read only memory (EPROM) or electrically erasable programmable read only memory (EEPROM).

System 100 receives an initial address from host system (not shown) over address lines A (0–x) 102. The initial address identifies a word of data within a page of data stored in nonvolatile memory array 105. When address strobe (AS) goes low, a new address is presented to system 100. When AS goes high, system 100 latches the initial address from address lines A (0–x) 102. Each address identifies a 16-bit word stored in nonvolatile memory 105. The low order bits of the initial address, A(0–1) 106 are, provided to page/word counter 170, and latched by word pointer 175. Burst wrap configuration bit 176 is provided to MUX 130 to indicate if multi-word burst-access wrap is used within the burst length boundary or to cross the boundary to perform linear accesses. The high order bits of the initial address, A (2–x) 104, are provided to address latch/counter 110 and latched by page pointer 180. The high order bits stored in page pointer 180 are supplied to nonvolatile memory array 105 over lines PP (2–x) 112. Page pointer 180 points to a 64-bit page of four 16-bit words of data in nonvolatile memory array 105. The page of data includes the word of data indicated by the initial address.

A set time after page pointer 180 is provided to nonvolatile memory array 105, page sense 115 provides the page of data to page latch 120. The amount of time depends on the access latency for nonvolatile memory array 105. Word pointer 175 is coupled to the select lines of word select MUX 130 over lines WP (0–1) 114. Since word pointer 175 is initially loaded with the low order address bits provided by the host system, word pointer 175 points to the word of data in the page of data indicated by the initial address.

Burst wrap configuration bit 176 controls the wait signal 116. Wait signal 116 informs the system processor of the valid data availability and may hold off memory fetches. If the burst configuration bit 176 is set to wrap on 4-word burst lengths, then possible linear burst sequences are 0-1-2-3, 1-2-3-0, 2-3-0-1, and 3-0-1-2. Thus, depending on the configuration of the system, MUX 130 supplies words to latch 140 in those particular orders. If burst wrap configuration bit 176 is set to no wrap for 4-word burst lengths, then possible linear burst sequences are 0-1-2-3, 1-2-3-4, 2-3-4-5, 3-4-5-6, etc. With burst wrap configuration bit 176 set to no wrap, MUX 130 may supply a limited non-aligned sequential burst to latch 140. This reduces the number of internal device memory look-ups. The sequences require only one internal 4-word look-up of non-volatile memory array 105. Power is consumed only when sensing the required words. Thus, with burst wrap configuration bit 176 set to no wrap, the word of data is provided on the data lines corresponding to the word and sent to latch 140.

The clock signal (CLK) is provided by the host system to page/word counter 170 and latch 140. From the time the initial address is strobed into system 100 to the time the initial word of data reaches latch 140, page/word counter 170 may assert a number of wait states 116 forcing the host system to wait until valid data is available. On the next clock cycle after the word of data has been provided to latch 140, however, the word of data is read out of latch 140 to output pins Q (0–15). If the initial page of data within page latch 120 does not contain the continuous linear bursts, a new page of data will be fetched from non-volatile memory array 105. During non-wrap continuous burst reads, the page latch is aligned to begin reading words at the low order address. However, if the words of the 4-word burst happen to be at the end of a 16-word boundary, a new page of memory is retrieved from non-volatile memory array 105. That is, when latching words 0, 1, 2, and 3, if word 2 is the last word on the 16-word boundary, the system would need to use the next cache line to latch the fourth word. Control logic 160 configures system 100 to identify a last word of data in a burst read operation. Control logic 160 senses the end of a page boundary and performs a subsequent retrieval of data from non-volatile memory 105. System 100 may be configured to read a fixed number of words in each burst read, wherein control logic 160 inform system 100 when to perform a burst read.

The page size, word size, page pointer size, and word pointer size may be configured differently in alternate embodiments. For example, in one embodiment, a page corresponds to an individually erasable block of non-volatile memory, wherein the block is 64 bits comprising four 16-bit words of data. A block size may be larger or smaller in alternate embodiments.

Figure 2:
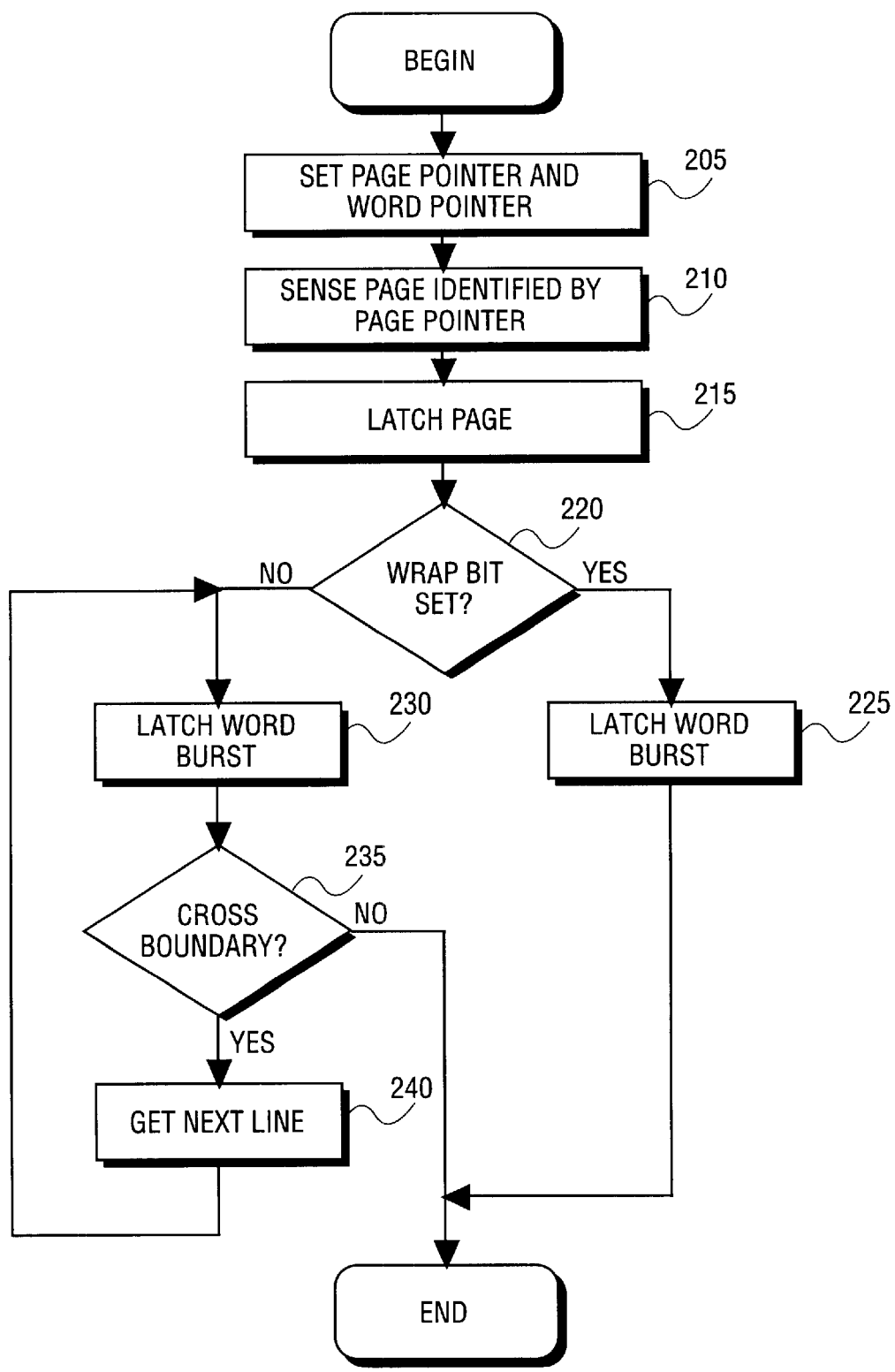
FIG. 2 is a flow diagram illustrating one embodiment for a limited length burst read operation performed by the apparatus of FIG. 1.

FIG. 2 is a flow diagram illustrating one embodiment of a burst read operation for system 100. Initially at processing block 205, the initial address provided by the host system is used to set page pointer 180 and word pointer 175. Page pointer 180 is used to sense a page of data from non-volatile memory array 105 in processing block 210. In processing block 215, the page of data is latched by page latch 120 a set time later, depending on the access latency of non-volatile memory array 105. A word identified by word pointer 175 is selected.

In one embodiment, the system configuration is set to hold down a 4-word burst page. In alternate embodiments, any word length page may be latched such as, for example, 2, 6, or 8 word page lengths. With a 4 word burst length, then possible linear burst sequences are 0-1-2-3, 1-2-3-4, 2-3-4-5, 3-4-5-6, etc. This allows limited non-aligned sequential bursts and reduces the number of external device memory lookups. The 4-word burst lengths require only one internal forward lookup versus three possible lookups in standard continuous burst mode. Power is consumed only when sensing the required words. Within the 4-word page, the words may be latched out beginning at a particular word. In addition, the words may be read out in any given order. In one embodiment, continuous burst is performed without word wrap. In one embodiment, a new 4-word page is not latched out of memory 105 until all words of the current page are latched out to latch 140. Thus, this system loads the 4-word page and latches out the pages without pre-fetching or pre-loading the next page of memory.

Next at processing block 120, it is determined whether burst wrap configuration bit 176 is set. If wrap bit 176 is set, the initial words are latched into latch 140. The words are linear burst in the particular sequence for the configuration of the system. Thus, MUX 130 supplies words to latch 140 in a particular order. For example, the MUX may supply words to latch 140 in a 2-3-4-5-burst order or the like.

If at processing block 220, burst wrap configuration bit 176 is not set, the initial words are latched into latch 140 in a successive linear order. Thus, MUX 130 supplies words to latch 140 beginning with the word pointed to by a word pointer 175. If word pointer 175 points to word 2, MUX 130 latches words 2, 3, 4 and 5 into latch 140.

Next at processing block 235, it is determined whether the 4-word burst crosses over a cache line boundary. If the 4-word burst crosses over the boundary, memory 105 retrieves a new line of data at processing block 240. Once a new line of data is retrieved, sequential words of data are latched into latch 140 at processing block 230. For example, while latching words 2-3-4-5 if words 2 and 3 are at the end of a 16-word boundary, in order to read words 4 and 5, the next cache line would need to be retrieved. In one embodiment, if a new line of data is to be retrieved, wait signal 116 is sent to the processor and memory 105 latches the next page into page latch 120.

Figure 3:
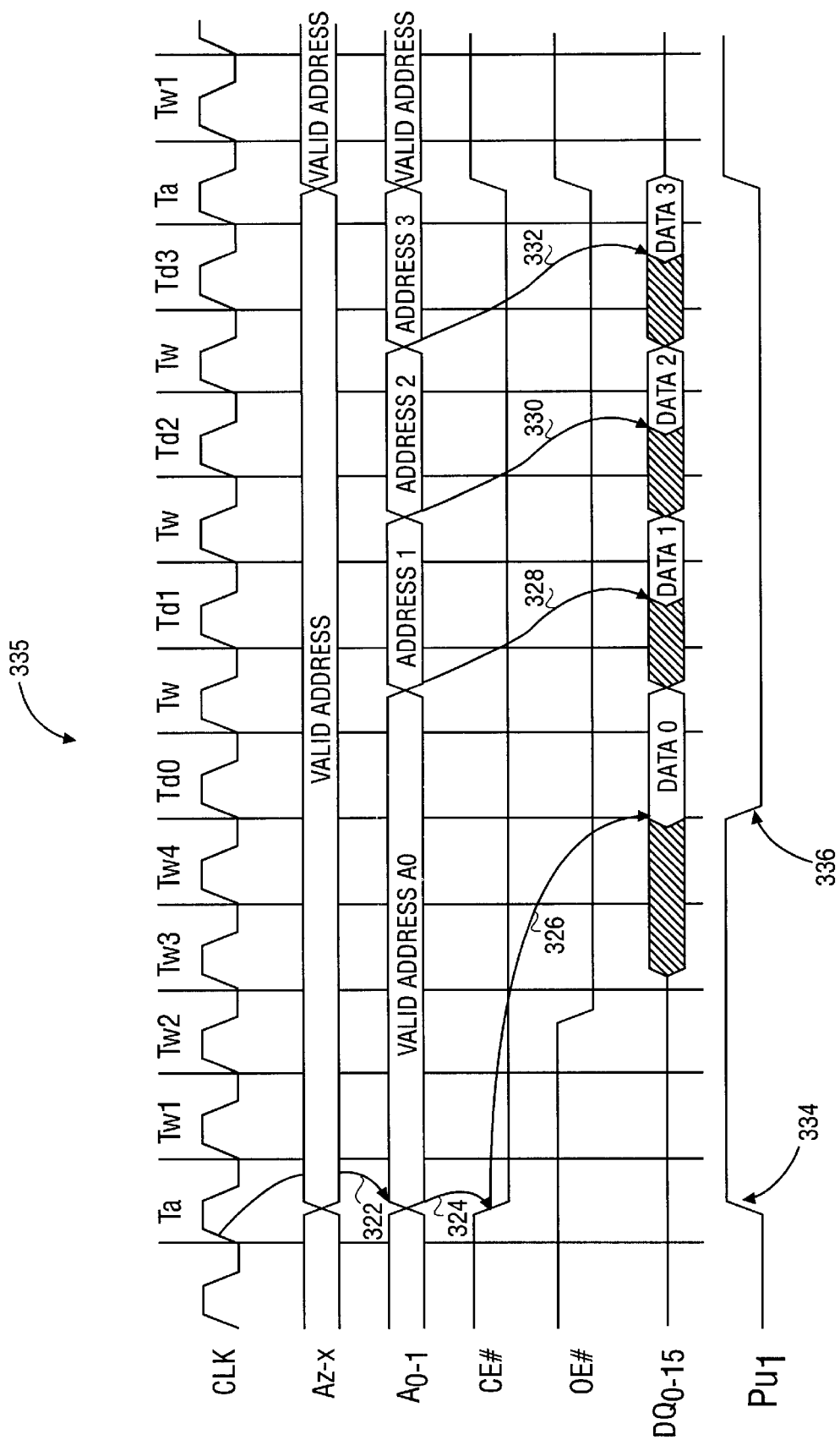
FIG. 3 is a timing diagram for one embodiment of the apparatus of FIG. 1.

FIG. 3 is a timing diagram 335 of a sequence of read operations performed on the flash memory device of FIG. 1. The signals shown include master clock signal CLK, page address $A_2$–x, word-select address $A_{0-1}$, chip enable CE#, output enable OE#, and data output $DQ_{0-1}$. Use The page address $A_2$–x and word-select address $A_{0-1}$ are each constituents of a single address $A_{0-x}$ asserted by a processor. It will be appreciated that the precise number of bits included in page address $A_2$–x or word-select address $A_{0-1}$ may vary between implementations. Gridlines coinciding with each rising edge of the master dock signal CLK are shown to delineate the respective cycle periods of the master clock signal CLK.

During a first cycle period $T_a$ of the master clock signal CLK, a new address, designated Address 0 and including bits $A_{0-x}$, is input to the page-mode flash memory device. Due to bus capacitance, a settling time, indicated by arrow 322, is required before page address $A_2$–x and word-select address $A_{0-1}$ become valid. Once the page address $A_2$–x becomes valid, address decode logic external to the flash memory device asserts chip enable CE# to enable the page address $A_2$–x into the flash memory device. As indicated by arrow 324, a propagation delay is incurred before the chip enable CE# transitions to an active low potential. Chip enable CE# continues to be asserted at the active low potential so long as page address $A_2$–x remains unchanged.

As indicated by arrow 326, cycles $T_{w1}$, $T_{w2}$, $T_{w3}$ $T_{w4}$ of master clock signal CLK are completed before the addressed word, Data 0, becomes valid. Master clock cycles $T_{w1}$, $T_{w2}$, $T_{w3}$, and $T_{w4}$ represent wait states required to allow the flash memory array to be accessed. During these wait states, the processor is essentially idle. The output enable signal OE# transitions to an active low potential some time before Data 0 becomes valid to allow Data 0 to be output to a data bus. The processor reads Data 0 during cycle $T_{d0}$ of the master clock signal CLK and then asserts a new address, Address 1, at the rising edge of the subsequent clock cycle, $T_w$.

Assuming that Address 1 includes the same page address as Address 0, the page address asserted to the flash memory device during clock cycle $T_a$ remains valid so that the chip enable CE# and output enable OE# signals remain active. In addition, the pending page of memory contains the data values, Data 1, Data 2, and Data 3, indicated by Address 1, Address 2, and Address 3 respectively. Consequently, the time required for Data 1 to become valid is significantly less than the time required for Data 0 to become valid. More specifically, as indicated by arrow 28, Data 1 becomes valid during the cycle $T_{d1}$, of the master dock signal which immediately follows the clock cycle $T_w$, in which Address 1 was asserted. The consequence of the reduced time for Data 1 to become valid is a reduced read cycle time for Data 1 (two master clock cycles) compared to the read cycle time for Data 0 (six master dock cycles). As indicated by arrows 330 and 332, respectively, additional data values from the pending page of memory, Data 2 and Data 3, are also addressed and output within two master clock cycles each. Consequently, the total number of clock cycles required for the processor to read four data values from the flash memory device can be reduced from a possible twenty-four clock cycles (4 words×6 clock cycles per word) to twelve clock cycles.

FIG. 3 also contains an indication of the memory 105 power usage of the FIG. 1 system, $PU_1$. Power becomes active upon the assertion of Address 0 at cycle $T_a$ (indicated by arrow 334). Power is active until Data 0 is available to MUX 130. Once the data is available, memory 105 does not require power and $PU_1$ drops, as shown at arrow 336. In continuous linear mode, however, power would not drop at 336 because memory 105 would be looking up a new page of data to be loaded. In one embodiment, once memory 105 latches the 4-word burst data onto page latch 120, $PU_1$ would drop down and remain low until the next fetch operation would be required.

Figure 4:
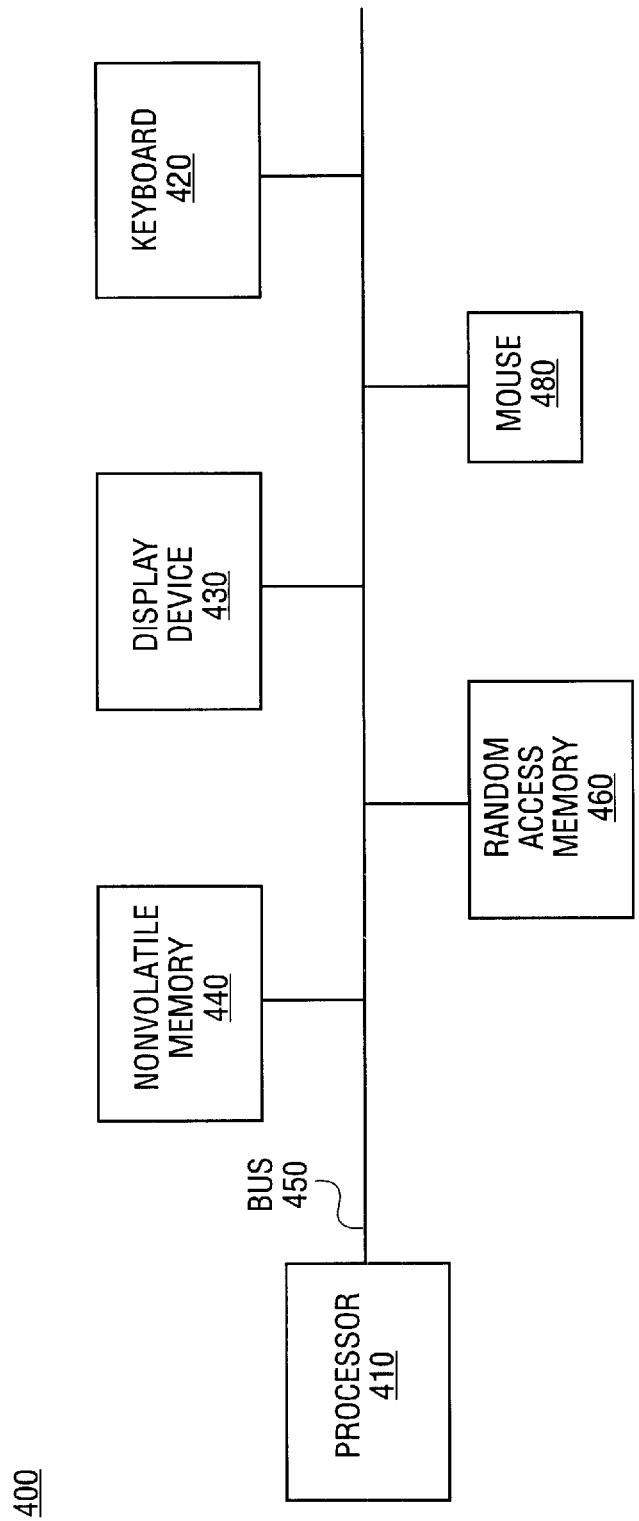
FIG. 4 is a block diagram of an example computer system in which the apparatus of FIG. 1 may be employed.

FIG. 4 is intended to represent a broad category of computer systems including, but not limited to, those based on the Pentium® processor, Pentium® Pro processor, or Pentium® II processor manufactured by and commonly available from Intel Corporation of Santa Clara, Calif., or the Alpha® processor manufactured by Digital Equipment Corporation of Maynard, Mass. In FIG. 4, processor 410 includes one or more microprocessors. Processor 410 is coupled to nonvolatile memory 440 and random access memory 460 by bus 450. Input/Output devices, including display device 430, keyboard 420, and mouse 480, are also coupled to bus 450. A number of additional components can be directly or indirectly coupled to bus 450 including, but not limited to, a bus bridge to another bus, an internet interface, additional audio/video interfaces, additional memory units, and additional processor units. Some or all of the components can be eliminated, rearranged, or combined.

In one example, nonvolatile memory 440 is incorporated with the teachings of system 100, as depicted in FIG. 1. A burst read order, an initial address, an address strobe signal, and a clock signal are all provided by processor 410. In this fashion, processor 410 initiates a burst read operation from nonvolatile memory 440 without incurring wait states after an initial number of wait states.

In another example, nonvolatile memory 440 is incorporated with the functionality of nonvolatile memory array 105, page sense 115, page latch 120, word select MUX 130, and latch 140. The functionality of address latch/counter 110, control logic 160, control 125, page/word counter 170, and word pointer 175 are executed by processor 410 as a series or sequence of instructions or function calls. Alternately, one or more ASICs (application specific integrated circuits) are endowed with this functionality, and inserted into system 400 as a separate component, or combined with another component.

System 100 can be used in a wide variety of burst read implementations including, but not limited to, downloading an image from a digital camera, downloading BIOS (Basic Input/Output System), downloading voice/music audio data, and downloading network files. The present invention can also be beneficially used to improve burst code execution from flash memory. The teachings of the present invention are not limited to flash memory, and can be employed with a variety of nonvolatile and volatile memory devices.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method of controlling a burst sequence in a synchronous memory, the method comprising:

indicating a current page of data by a page pointer, the page pointer initially corresponding to N high order bits of an address of a first word of data, the current page of data containing a fixed number of words of data;

indicating a first word of data in the current page of data by a word pointer, the word pointer initially corresponding to M low order bits of the address of the first word of data;

latching the current page of data; and sensing a wrap-bit, such that if the wrap-bit is not set, the words of data are read in a sequential burst read order beginning at the first word, the wrap-bit controlling a wait signal of the synchronous memory, such that if valid data is not available fetches to the synchronous memory are suspended.

2. The method of claim 1 wherein the fixed number of words of data is four.

3. The method of claim 1 wherein the synchronous memory is implemented in a flash memory array, the flash memory array comprising a plurality of memory cells.

4. An apparatus for controlling a burst sequence in a synchronous memory, the apparatus comprising:

a synchronous memory;

a page pointer, coupled to the synchronous memory, configured to indicate a current page of data, the page pointer initially corresponding to N high order bits of an address of a first word of data, a plurality of sense amplifiers, coupled to the synchronous memory, configured to sense the current page of data;

a page latch, coupled to the plurality of sense amplifiers, to latch the current page of data;

a multiplexer, coupled to a data latch, configured to select a word of data to output from the current page of data;

a page/word counter, coupled to the address latch counter data latch, and multiplexer, to adjust the page pointer, indicate when to latch the current page of data, indicate a page word length, and latch and adjust a word pointer, the word pointer indicating one of the plurality of words to read, the word pointer initially corresponding to M low order bits of the address of the first word of data wherein;

a control logic, coupled to the page/word counter, to control operation of the page/word counter; and a wrap-bit, such that if the wrap-bit is not set, the words of data are read in a sequential burst read order beginning at the first word, the wrap-bit controlling a wait signal of the synchronous memory, such that if valid data is not available fetches to the synchronous memory are suspended.

5. The apparatus of claim 4 wherein the synchronous memory is implemented in a flash memory array, the flash memory array comprising a plurality of memory cells.

6. An article of manufacture having one or more computer-readable medium with executable instructions therein, which when executed by a processing device causes the processing device to perform a method, the method comprising:

indicating a current page of data by a page pointer, the page pointer initially corresponding to N high order bits of an address of a first word of data, the current page of data containing a fixed number of words of data;

indicating a first word of data in the current page of data by a word pointer, the word pointer initially corresponding to M low order bits of the address of the first word of data;

latching the current page of data; and sensing a wrap-bit, such that if the wrap-bit is not set, the words of data are read in a sequential burst read order beginning at the first word, the wrap-bit controlling a wait signal of a memory, such that if valid data is not available fetches to the memory are suspended.

* * * * *